(12) United States Patent
Okumura

(10) Patent No.: US 6,370,176 B1
(45) Date of Patent: Apr. 9, 2002

(54) GALLIUM NITRIDE GROUP SEMICONDUCTOR LASER DEVICE AND OPTICAL PICKUP APPARATUS

(75) Inventor: Toshiyuki Okumura, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/366,020

(22) Filed: Aug. 2, 1999

(30) Foreign Application Priority Data

Aug. 4, 1998 (JP) .......................................... 10-220221

(51) Int. Cl.⁷ ................................................. H01S 5/20
(52) U.S. Cl. ........................................................ 372/45
(58) Field of Search ............................................ 372/45

(56) References Cited

U.S. PATENT DOCUMENTS 5,974,069 A * 10/1999 Tanaka et al. ................. 372/45
6,031,858 A * 2/2000 Hatakoshi et al. ............ 372/45
6,067,309 A * 5/2000 Onomura et al. ............. 372/45

FOREIGN PATENT DOCUMENTS

JP 9191160 7/1997

OTHER PUBLICATIONS

"Characteristics of Room Temperature–CW Operated InGaN Multi–Quantum–Well–Structure Laser Diodes"; S. Nakamura; MRS Internet Journal; Nitride Semiconductor Research; vol. 2, Article 5, Mar. 5, 1997.

* cited by examiner

Primary Examiner—James W. Davie
(74) Attorney, Agent, or Firm—Renner, Otto, Boisselle & Sklar

(57) ABSTRACT

The gallium nitride group semiconductor laser device of this invention includes an active layer made of a nitride semiconductor formed between cladding layers and/or guide layers made of a nitride semiconductor on a substrate, wherein a light absorption layer is formed between the substrate and one of the cladding layers located closer to the substrate, the light absorption layer being made of a semiconductor having an energy gap substantially equal to or smaller than an energy gap of the active layer.

10 Claims, 5 Drawing Sheets

GALLIUM NITRIDE GROUP SEMICONDUCTOR LASER DEVICE AND OPTICAL PICKUP APPARATUS

BACKGROUND OF THE INVENTION

1. Field of the Invention

The present invention relates to a gallium nitride (GaN) group semiconductor laser device incorporated as a light source in an optical system of an optical pickup apparatus for an optical disk and the like.

2. Description of the Related Art

GaN group (GaInAlN) semiconductors are used as materials for semiconductor laser devices having an emission wavelength in a range of ultraviolet to green light wavelengths. A semiconductor laser device using GaN group semiconductors is described in MRS Internet J. Nitride Semiconductor Res. Vol. 2 (1997) Art. 5, for example. FIG. 4 shows a cross-sectional view of this conventional semiconductor laser device. Referring to FIG. 4, the semiconductor laser device includes a sapphire substrate 201, a GaN buffer layer 202, an n-type GaN contact layer 203, an n-type $In_{0.05}Ga_{0.95}N$ layer 204, an n-type $Al_{0.08}Ga_{0.92}N$ cladding layer 205, an n-type GaN guide layer 206, an active layer 207 of a multi-quantum well (MQW) structure composed of $In_{0.15}Ga_{0.85}N$ quantum well layers and $In_{0.02}Ga_{0.98}N$ barrier layers, a p-type $Al_{0.2}Ga_{0.8}N$ layer 208, a p-type GaN guide layer 209, a p-type $Al_{0.08}Ga_{0.92}N$ cladding layer 210, a p-type GaN contact layer 211, a p-side electrode 212, and an n-side electrode 213. Specifically, the MQW structure active layer 207 is composed of a total of seven layers, i.e., four $In_{0.15}Ga_{0.85}N$ quantum well layers each having a thickness of 3.5 nm and three $In_{0.02}Ga_{0.98}N$ barrier layers each having a thickness of 7 nm, which are alternately stacked. In this conventional semiconductor laser device, the p-type $Al_{0.08}Ga_{0.92}N$ cladding layer 210 and the p-type GaN contact layer 211 are etched to form a stripe-shaped ridge for narrowing current to be injected.

When a GaN group semiconductor laser device is used as a light source of an optical disk system, such a laser device is of a self-oscillation type which outputs modulated light power for injection of a constant current, so as to prevent an occurrence of data read error due to noise generated during data read. A semiconductor laser device of this type is described in Japanese Laid-Open Publication No. 9-191160. FIG. 5 shows a cross-sectional view of this conventional semiconductor laser device. Referring to FIG. 5, the semiconductor laser device includes an n-type SiC substrate 221, an n-type AlN buffer layer 222, an n-type AlGaN cladding layer 223, an n-type GaN optical guide layer 224, an $In_{0.05}Ga_{0.95}N$ quantum well active layer 225 having a thickness of 10 nm, a p-type GaN optical guide layer 226, a p-type AlGaN cladding layer 227, a p-type $In_{0.1}Ga_{0.9}N$ saturable absorption layer 228 having a thickness of 5 nm, a p-type GaN contact layer 209, a p-side electrode 230, and an n-side electrode 231. In this conventional semiconductor laser device, part of light generated in the active layer 225 is absorbed by the saturable absorption layer 228. This changes the absorption coefficient of the saturable absorption layer 228, and with this change of the absorption coefficient, the intensity of laser-oscillated light emitted from the active layer 225 cyclically changes.

As a result, the interference of output light from the semiconductor laser device decreases. If a semiconductor laser device having a low interference is used as a light source of an optical disk system, output light from the semiconductor laser device does not interfere with return light which has directly returned to the active region of the semiconductor laser device after being reflected from a disk. This suppresses generation of noise and thus prevents occurrence of data read error.

When the semiconductor laser device with the above construction is incorporated as a light source in an optical system of an optical pickup apparatus for an optical disk and the like, a tracking servo mechanism is required to accurately focus a spot of a laser beam emitted from the semiconductor layer device on a pit array formed on a surface of the disk. This tracking servo mechanism normally employs a technique called a three-beam method for detecting a displacement of a spot from a pit.

FIG. 6 schematically shows an optical pickup apparatus employing the above technique. Referring to FIG. 6, laser light 242 emitted from a semiconductor layer device 241 is split into three beams by a diffraction grating 243. The split beams pass through a non-polarizing beam splitter 244 and a collimator lens 245 to be collimated. The collimated beams are then focused by an object lens 246 on an information recording surface of a disk 247 on which a pit array is formed. The three beams focused and reflected from the information recording surface of the disk 247 are guided back to the non-polarizing beam splitter 244 via the object lens 246 and the collimator lens 245, to be received respectively by photodiodes 248, 249, and 250. The photodiode 248 functions to read a signal representing a pit array recorded on the information recording surface of the disk 247, while the photodiodes 249 and 250 function to detect a displacement of a spot of a laser beam from a pit. The positions of the object lens 246 and the like are adjusted in accordance with the outputs from the photodiodes 249 and 250, so that a spot of a laser beam can be accurately focused on a pit array formed on the surface of the disk.

In the above three-beam method, three beams reflected from the information recording surface of the disk 247 are not only reflected from the non-polarizing beam splitter 244 to be received by the photodiodes 248, 249, and 250, but partly pass through the non-polarizing beam splitter 244 to be incident on the diffraction grating 243. The incident converged beam is divided into three beams by the diffraction grating 243 to illuminate the surface of the semiconductor laser device 241 as return light. In FIG. 6, the illumination positions of the three return beams are denoted by A, B, and C.

FIG. 7 is a front view of the semiconductor laser device 241 for illustrating the illumination positions of the three return beams. At the illumination position A, the return beam directly returns to the active region of the semiconductor laser device 241. The illumination positions B and C of the return beams are away from the illumination position A downward and upward, respectively, by a distance of about 20 μm to 50 μm. In the conventional semiconductor laser device shown in FIG. 5, the saturable absorption layer 228 is provided for suppressing generation of noise due to interference between output light of the laser device and return light at the illumination position A.

The conventional GaN group semiconductor laser device has the following problems.

Three return beams are produced in the case of employing the three-beam method shown in FIGS. 6 and 7. Among the three beams, the return beam at the illumination position B is incident on the substrate of the semiconductor laser chip. If the substrate is made of a material having a small absorption coefficient with respect to laser light, such as sapphire and silicon carbide, the return beam at the illumination position B is subjected to multiple reflection inside the substrate forming an interference pattern. The conventional GaN group semiconductor laser device uses sapphire or silicon carbide as a material of the substrate. Further, no layer for absorbing laser light is formed between the active layer and the substrate. It has been found, therefore, that an interference pattern formed by the return beam at the illumination position B and the laser light in the active region interact with each other, resulting in influencing the intensity of the output light of the semiconductor laser device.

A disk is rotated in an optical disk system so that data is read from the disk. During the rotation, the disk tends to tilt slightly, and the angle of this tilt varies with the rotation of the disk. This variation in the tilt angle of the disk causes the illumination position B to change slightly and thus change the interference pattern formed by the return beam at the illumination position B. As a result, the intensity of the output light of the semiconductor laser device is influenced and varied. If the intensity of the output light varies, such a semiconductor laser device is not practically usable as a light source of an optical disk system.

As described above, the conventional GaN group semiconductor laser devices are not prepared for being incorporated in an optical system of an optical pickup apparatus employing the three-beam method.

SUMMARY OF THE INVENTION

The gallium nitride group semiconductor laser device of this invention includes an active layer made of a nitride semiconductor formed between cladding layers and/or guide layers made of a nitride semiconductor on a substrate, wherein a light absorption layer is formed between the substrate and one of the cladding layers located closer to the substrate, the light absorption layer being made of a semiconductor having an energy gap substantially equal to or smaller than an energy gap of the active layer.

In one embodiment of the invention, the light absorption layer is of a multi-quantum well structure including two types of semiconductors having different compositions which are alternately stacked.

In another embodiment of the invention, the light absorption layer is made of a nitride semiconductor containing at least indium and gallium.

In still another embodiment of the invention, the substrate is made of a material selected from the group consisting of sapphire, gallium nitride, and silicon carbide.

In still another embodiment of the invention, the thickness of the light absorption layer is 0.05 $\mu$m or more.

According to another aspect of the invention, an optical pickup apparatus is provided. The optical pickup apparatus is of a three-beam method including at least a semiconductor laser device and a diffraction grating, wherein the semiconductor laser device is a gallium nitride group semiconductor laser device according to the present invention.

The gallium nitride (GaN) group semiconductor laser device according to the present invention includes an active layer made of a nitride semiconductor sandwiched between cladding layers and/or guide layers made of nitride semiconductors formed on a substrate. A light absorption layer is formed between the substrate and one of the cladding layers located closer to the substrate, i.e., the lower cladding layer. The light absorption layer is made of a semiconductor having an energy gap substantially equal to or smaller than that of the active layer. With this construction, return light which is incident on the substrate after being reflected from a disk is blocked from entering the active layer by the light absorption layer formed between the substrate and the lower cladding layer. Accordingly, an interference pattern, which may be generated in the substrate by the return light, is prevented from interacting with laser light in the active region, keeping the intensity of output light of the semiconductor laser device from being influenced by the interference pattern. The resultant GaN group semiconductor laser is free from data read error and thus can be practically used as a light source of an optical disk system.

Since the absorption layer is provided between the substrate and the lower cladding layer, laser light propagating in the active layer of the semiconductor laser device does not expand to reach the absorption layer. The absorption layer therefore does not absorb laser light propagating in the semiconductor laser device, but absorbs only return light incident on the substrate from the disk. Thus, the laser characteristics such as the oscillation threshold current value and the maximum light power are not degraded.

Further, if a nitride semiconductor containing at least indium and gallium is used as a material of the light absorption layer, the formation of the light absorption layer is facilitated since the energy gap of this layer can be reduced only by increasing the content of indium. Moreover, since the light absorption layer is made of the same group of nitride semiconductor material as that used for the active layer and the cladding layers, the crystallinity will not be lost during the formation of the multi-layer structure by crystal growth. This is markedly advantageous for improving the reliability of the laser device.

It has been further found that the reliability improves if the light absorption layer is formed of a nitride semiconductor containing at least indium and gallium with a larger content of indium between the substrate and the lower cladding layer, compared with the case where no light absorption layer is formed. Normally, a GaN group semiconductor laser device has a difference in thermal expansion coefficient among a substrate and respective layers formed thereon. Thermal distortion is therefore generated while the temperature is being lowered to room temperature after crystal growth. Such thermal distortion generates a stress, which in return facilitates expansion of a defect existing in the crystal, causing degradation of the semiconductor laser device. According to the present invention where the light absorption layer made of a nitride semiconductor containing a large content of indium is formed, the volume elasticity is small due to the large content of indium. Such a light absorption layer can relieve the thermal distortion and thus relieve and reduce the stress in the crystal. As a result, expansion of a defect in the crystal is not facilitated, and thus the reliability of the semiconductor laser device improves.

Such a light absorption layer is not necessarily a single layer, but may be of a multi-quantum well structure composed of two types of semiconductors having different compositions alternately stacked. If a multi-quantum well structure is adopted, the densities of state at the ends of the conduction band and valence band increase due to a quantum effect, increasing light absorption. In addition, since interfaces between stacked semiconductor layers reflect light, return light incident on the substrate from a disk can be absorbed with high efficiency.

The lattice constant of the light absorption layer made of a nitride semiconductor containing at least indium and gallium described above becomes large as the content of indium thereof increases. Accordingly, a distortion may be generated if the thickness of this layer is large, resulting in a loss of crystallinity. This problem is overcome by adopting the multi-quantum well structure composed of two types of nitride semiconductors having different indium contents alternately stacked. That is, one of the nitride semiconductors having a smaller content of indium can relieve this distortion. Thus, the light absorption layer can be formed without the loss of crystallinity.

According to the present invention, the light absorption layer provided between the substrate and the lower cladding layer prevents return light incident on the substrate from a disk from entering the active layer. In consideration of this point, the present invention is especially effective for a GaN group semiconductor laser device having a substrate made of sapphire, gallium nitride, or silicon nitride which has a small light absorption coefficient with respect to laser light output from the active layer made of a nitride semiconductor.

Furthermore, in order to sufficiently absorb return light incident on the substrate from a disk, the thickness of the light absorption layer is preferably 0.05 $\mu$m or more. FIG. 3 shows the measurement results of the attenuation of the intensity of laser light having a wavelength of 410 nm with respect to the thickness of an $In_{0.2}Ga_{0.08}N$ light absorption layer. As is observed from this figure, when the thickness of the light absorption layer is 0.05 $\mu$m or more, the light intensity is sufficiently attenuated, indicating that return light incident on the substrate from a disk is prevented from entering the active layer. The same results are obtained for a light absorption layer made of other material of GaN group semiconductor and for a light absorption layer of a multi-quantum well structure composed of two types of semiconductors having different compositions alternately stacked. Thus, the use of a light absorption layer having a thickness of 0.05 $\mu$m or more enables realization of a GaN group semiconductor laser device practically usable as a light source of an optical disk system without causing data read error.

Thus, the invention described herein makes possible the advantages of (1) providing a gallium nitride group semiconductor laser device capable of being used as a light source of an optical disk system, and (2) providing an optical pickup apparatus using such a gallium nitride group semiconductor laser device.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of examples with reference to the accompanying drawings.

Example 1

Figure 1:
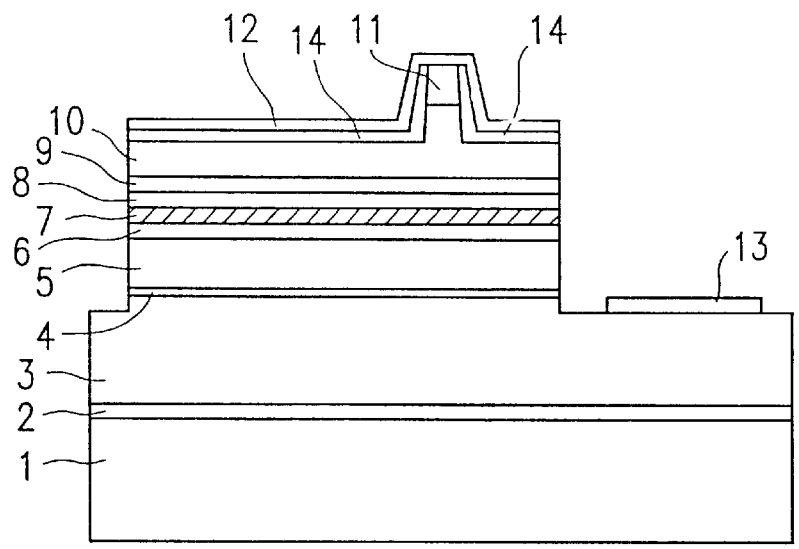
FIG. 1 is a sectional view of a semiconductor laser device of Example 1 according to the present invention.

FIG. 1 is a cross-sectional view of a GaN group semiconductor laser device of Example 1 according to the present invention. Referring to FIG. 1, the GaN group semiconductor laser device of Example 1 includes a sapphire substrate 1 using c plane as a surface, a GaN buffer layer 2, an n-type GaN contact layer 3, an n-type $In_{0.2}Ga_{0.8}N$ light absorption layer 4, an n-type $Al_{0.1}Ga_{0.9}N$ cladding layer 5, an n-type GaN guide layer 6, an active layer 7 of a multi-quantum well (MQW) structure composed of three $In_{0.15}Ga_{0.85}N$ quantum well layers and two $In_{0.03}Ga_{0.97}N$ barrier layers, an $Al_{0.2}Ga_{0.8}N$ evaporation prevention layer 8, a p-type GaN guide layer 9, a p-type $Al_{0.1}Ga_{0.9}N$ cladding layer 10, a p-type GaN contact layer 11, a p-side electrode 12, an n-side electrode 13, and an $SiO_2$ insulating film 14.

According to the present invention, the surface of the sapphire substrate 1 may be of another plane such as an a plane, an r plane, and an m plane. As a material of the substrate, GaN, SiC, spinel, MgO and the like can also be used in place of sapphire. All of these materials have a small absorption coefficient with respect to laser light. Thus, in combination with the light absorption layer according to the present invention, the resultant GaN semiconductor laser device is free from occurrence of data read error.

In the case of a GaN or SiC substrate, the difference in lattice constant is small between the substrate and a GaN group semiconductor material grown on the substrate, compared with the case of the sapphire substrate, allowing for formation of a film with good crystallinity and thus improving the reliability of the resultant laser device. Also, a GaN or SiC substrate are likely to be easily cleaved, compared with the case of the sapphire substrate. It has therefore an advantage that an end face of a laser resonator can be easily formed by cleaving.

The buffer layer 2 may be made of a material other than GaN, such as AlN or AlGaN three-component mixed crystal, as long as a GaN group semiconductor can be grown on the buffer layer by epitaxy.

The light absorption layer 4 may be made of a material other than $In_{0.2}Ga_{0.8}N$ as long as the material can absorb laser light. For example, InGaN three-component mixed crystal or InGaAlN four-component mixed crystal having an In content larger than that of the $In_{0.15}Ga_{0.85}N$ quantum well layers constituting the MQW structure of the active layer 7 can be used.

The n-type cladding layer 5 and the p-type cladding layer 10 may be made of an AlGaN three-component mixed crystal other than $Al_{0.1}Ga_{0.9}N$. As the Al content of the AlGaN mixed crystal is made larger, the differences in energy gap and refractive index increase between the active layer and the cladding layers, allowing carriers and light to be effectively confined within the active layer, and thus realizing reduction in oscillation threshold current and improvement in temperature characteristics. As the Al content is made smaller while the confinement of carriers and light is maintained, the mobility of carriers in the cladding layers increases, allowing for reduction in resistance of the resultant semiconductor laser device. The cladding layers may be made of four or more component mixed crystal containing a small amount of an element or elements in addition to the above three elements. The composition of the mixed crystal may be different between the n-type cladding layer 5 and the p-type cladding layer 10.

The guide layers 6 and 9 may be made of a material other than GaN as long as the energy gap of the material is a value between the energy gap of the quantum well layers constituting the MQW structure active layer 7 and the energy gap of the cladding layers 5 and 10. For example, InGaN three-component mixed crystal, AlGaN three-component mixed crystal, InGaAlN four-component mixed crystal may be used. Donors or acceptors may not be doped in the entire guide layers, but a portion of each guide layer facing the MQW structure active layer 7 may be non-doped. Further, the entire guide layer may be non-doped. In the latter case, since the number of carriers existing in the guide layer is small, light absorption by free carriers is reduced, and thus the oscillation threshold current can be advantageously reduced.

The compositions of the three $In_{0.15}Ga_{0.85}N$ quantum well layers and two $In_{0.03}Ga_{0.97}N$ barrier layers constituting the MQW structure active layer 7 may be determined in accordance with a required laser oscillation wavelength. If a long oscillation wavelength is desired, the In content of the quantum well layers is made large. If a short oscillation wavelength is desired, the In content of the quantum well layers is made small. The quantum well layers and the barrier layers may be made of four or more component mixed crystal including a small amount of an element or elements in addition to the InGaN three-component mixed crystal. The barrier layers maybe made of mere GaN. The number of quantum well layers and barrier layers maybe different from those in this example. Alternatively, the active layer may be of a single quantum well structure. In order to obtain the self-oscillation property for suppressing noise generated due to return light directly incident on the active region, the number of quantum well layers constituting the active layer is preferably two or three. With this number of quantum well layers, carriers in the active layer are likely to be easily modulated. If the number of quantum well layers is larger, carriers will not be injected uniformly in the respective quantum well layers. In the case of a single quantum well layer, the carrier density becomes large. In either case, the modulation of carriers in the active layer becomes less easy.

In this example, the $Al_{0.2}Ga_{0.8}N$ evaporation prevention layer 8 is formed directly on the MQW structure active layer 7 for preventing the MQW structure active layer 7 from evaporating by a temperature rise required for growing the p-type GaN guide layer 9 which is to be grown after the formation of the MQW structure active layer 7. If this purpose is attained, the evaporation prevention layer 8 may also be made of a material other than $Al_{0.2}Ga_{0.8}N$ as long as the material can protect the quantum well layer. For example, AlGaN three-component mixed crystal having an Al content different from the above value and GaN may be used. Alternatively, the $Al_{0.2}Ga_{0.8}N$ evaporation prevention layer 8 may be doped with Mg. This is advantageous because it becomes easy to inject holes from the p-type GaN guide layer 9 and the p-type $Al_{0.1}Ga_{0.9}N$ cladding layer 10 to the MQW structure active layer 7. If the In content of the quantum well layers is small, the quantum well layer is prevented from evaporating by the temperature rise. In this case, therefore, the formation of the $Al_{0.2}Ga_{0.8}N$ evaporation prevention layer 8 can be omitted without losing the characteristics of the GaN group semiconductor layer device.

Hereinafter, the method for fabricating the GaN group semiconductor laser device with the above construction will be described with reference to FIG. 1. In this example, a metal organic chemical vapor deposition (MOCVD) method is employed. Other methods may also be employed as long as a GaN group semiconductor can be epitaxially grown. For example, other vapor phase growth methods such as a molecular beam epitaxy (MBE) method and a hydride vapor phase epitaxy (HVPE) method can be employed.

The sapphire substrate 1 having a thickness of 350 $\mu$m is put in a growth oven, and the GaN buffer layer 2 is grown to a thickness of 35 nm on a c plane surface of the substrate 1 using trimethyl gallium (TMG) and ammonia ($NH_3$) as materials at a growth temperature of 550° C.

The growth temperature is raised to 1050° C. to grow the Si-doped n-type GaN contact layer 3 to a thickness of 3 $\mu$m using TMG, $NH_3$, and silane gas ($SiH_4$) as materials. The growth temperature is then lowered to 750° C. to grow the Si-doped n-type $In_{0.2}Ga_{0.8}N$ light absorption layer 4 to a thickness of 0.1 $\mu$m using TMG, $NH_3$, $SiH_4$, and trimethyl indium (TMI) as materials. The growth temperature is raised again to 1050° C. to grow the Si-doped n-type $Al_{0.1}Ga_{0.9}N$ cladding layer 5 to a thickness of 0.5 $\mu$m using TMG, $NH_3$, $SiH_4$, and trimethyl aluminium (TMA) as materials. With the growth temperature kept at 1050° C., the Si-doped n-type GaN guide layer 6 is grown to a thickness of 0.1 $\mu$m using the above materials other than TMA.

The growth temperature is lowered again to 750° C. to grow three $In_{0.15}Ga_{0.85}N$ quantum well layers (thickness: 5 nm each) and two $In_{0.03}Ga_{0.97}N$ barrier layers (thickness: 5 nm each) alternately to form the MQW structure active layer 7 (total thickness: 25 nm), using TMG, $NH_3$, and TMI as materials. With the growth temperature kept at 750° C., the $Al_{0.2}Ga_{0.8}N$ evaporation prevention layer 8 is grown to a thickness of 10 nm using TMG, TMA, and $NH_3$ as materials.

The growth temperature is raised again to 1050° C. to grow the Mg-doped p-type GaN guide layer 9 to a thickness of 0.1 $\mu$m using TMG, $NH_3$, and cyclopentadiene magnesium ($Cp_2Mg$) as materials. Subsequently, with the growth temperature kept at 1050° C., the Mg-doped p-type $Al_{0.1}Ga_{0.9}N$ cladding layer 10 is grown to a thickness of 0.5 $\mu$m using TMA in addition to the above materials. Still keeping the growth temperature at 1050° C., the Mg-doped p-type GaN contact layer 11 is grown to a thickness of 0.5 $\mu$m using the above materials except for TMA. Thus, a GaN group epitaxial wafer is completed. This wafer is then annealed in a nitrogen gas atmosphere at 800° C. to reduce the resistance of the Mg-doped p-type layers.

The resultant wafer is partially etched from the top surface of the p-type GaN contact layer 11 until the n-type GaN contact layer 3 is exposed by a normal photolithographic and dry etching method, to form a mesa structure of a 200 $\mu$m-wide stripe shape. Subsequently, the remaining p-type GaN contact layer 11 and p-type $Al_{0.1}Ga_{0.9}N$ cladding layer 10 are partially etched by the same photolithographic and dry etching method so that a ridge structure of a 1.5 $\mu$m-wide stripe shape is formed on the mesa structure. Thereafter, the $SiO_2$ insulating film 14 with a thickness of 200 nm is formed on the side walls of the ridge and on the surface of the p-type layer except for the top surface of the ridge as a current blocking layer.

The p-side electrode 12 made of nickel and gold is formed on the surfaces of the $SiO_2$ insulating film 14 and the p-type GaN contact layer 11. The n-side electrode 13 made of titanium and aluminium is formed on the surface of the exposed n-type GaN contact layer 3. Thus, a GaN group semiconductor laser device wafer is completed.

The back surface of the sapphire substrate 1 of this wafer is polished by a normal polishing technique to obtain a thickness of 50 μm. The wafer is then cleaved in a direction perpendicular to the direction of the ridge stripe to form the end face of a laser resonator which extends in the direction of the ridge stripe. In this example, the length of the resonator is 500 μm. The resultant laser device is divided into laser chips. Each chip is mounted on a stem and the electrodes are connected to respective lead terminals by wire bonding, thereby to complete the GaN group semiconductor laser device.

The thus-fabricated GaN group semiconductor laser device has an oscillation wavelength of 410 nm and an oscillation threshold current of 30 mA, exhibiting good laser characteristics. Such a low oscillation threshold current value is obtained because the light absorption layer 4 exists between the n-type cladding layer 5 and the sapphire substrate 1, and thus laser light generated in the active layer is prevented from reaching the light absorption layer 4 and being absorbed by the light absorption layer 4.

The sapphire substrate 1 of the semiconductor laser device has a thickness of 50 μm, and one of three return beams generated during the control of the tracking servo mechanism by the three-beam method as described above is incident on the sapphire substrate 1. However, the return light incident on the sapphire substrate is blocked from interacting with laser light in the active region by the existence of the light absorption layer 4. Thus, output light with stable intensity without an influence of return light is obtained from the semiconductor laser device.

In this example, since the width of the ridge stripe is as narrow as 1.5 μm, the portion of the active layer located outside the ridge stripe region works as a saturable absorption layer providing the self-oscillation property. This suppresses generation of noise caused by return light directly returning to the active region. As a result, when the present invention is used for an optical disk system, a practical GaN group semiconductor laser device which can prevent data read error is realized.

Although the thickness of the light absorption layer 4 is 0.1 μm in this example, an effect equivalent to that described above can be obtained as long as the thickness is 0.05 μm or more. In this example, the light absorption layer 4 is provided between the n-type contact layer 3 and the n-type cladding layer 5. Alternatively, it may be provided inside the n-type contact layer 3. The light absorption layer 4 may also be provided inside the n-type cladding layer 5 as long as it is away from the range of expansion of laser light generated in the active region.

In this example, the growth temperature is raised when the n-type cladding layer 5 is grown after the growth of the light absorption layer 4. In order to prevent the light absorption layer 4 from partly evaporating during this temperature rise, another evaporation prevention layer similar to the $Al_{0.2}Ga_{0.8}N$ evaporation prevention layer 8 may be sequentially formed on the light absorption layer 4.

In the GaN group semiconductor laser device of this example, the ridge stripe is narrowed to use the portion of the active layer located outside the ridge stripe region as a saturable absorption layer to provide the self-oscillation property. Alternatively, a portion of the active layer in the resonator direction may be blocked from current injection so as to be used as a saturable absorption layer. Otherwise, a saturable absorption layer may be formed inside the range of expansion of laser light generated in the active region to provide self-oscillation. In this example, the MQW structure active layer having three quantum well layers is used. The self-oscillation property can also be obtained when two quantum well layers are formed, suppressing noise generated due to return light directly returning to the active region.

In this example, the end face of the laser resonator is formed by cleaving. The sapphire substrate is so hard that cleaving may be difficult. In such a case, the resonator end face may be formed by dry etching.

In this example, since sapphire which is an insulator is used for the substrate, the n-side electrode 13 is formed on the surface of the n-type GaN contact layer 3 exposed by etching. If GaN, SiC, and the like having n-type conductivity are used for the substrate, the n-side electrode 13 may be formed on the back surface of the substrate. In this case, it is not necessary to form the 200 μm-wide stripe-shaped mesa structure by etching. The p-type and n-type conductivity may be reversed from the construction described above. In this example, the $SiO_2$ insulating film 14 is used as the current blocking layer. Alternatively, other dielectric insulating films such as an SiN film and n-type conductive and semi-insulating semiconductor materials may also be used as the current blocking layer.

Example 2

A GaN semiconductor laser device of Example 2 according to the present invention is fabricated in the same manner as that in Example 1, except that the light absorption layer is of a MQW structure having a total thickness of 0.065 μm composed of seven Si-doped n-type $In_{0.2}Ga_{0.8}N$ layers (thickness: 5 nm each) and six Si-doped n-type $In_{0.03}Ga_{0.97}N$ layers (thickness: 5 nm each), and that an Si-doped n-type $Al_{0.2}Ga_{0.8}N$ evaporation prevention layer is formed on the light absorption layer at the same growth temperature as that for the light absorption layer.

The thus-fabricated GaN group semiconductor laser device of this example has an oscillation wavelength of 410 nm and an oscillation threshold current of 30 mA, providing good laser characteristics as in Example 1. Since the light absorption layer 4 of the MQW structure is formed, return light incident on the sapphire substrate is blocked from interacting with laser light in the active region. Thus, the semiconductor laser device can provide output light with stable intensity without an influence of return light.

Further, in this example the light absorption layer is of a MQW structure, not a single-layer structure of the Si-doped n-type $In_{0.2}Ga_{0.8}N$ layer. This reduces crystal defects caused by a distortion due to the difference in lattice constant between the Si-doped n-type $In_{0.2}Ga_{0.8}N$ layers of the light absorption layer and the Si-doped n-type GaN contact layer. Also, the Si-doped n-type $Al_{0.2}Ga_{0.8}N$ evaporation prevention layer serves to prevent evaporation of the Si-doped n-type $In_{0.2}Ga_{0.8}N$ layers, and thereby to improve the crystallinity of the overlying Si-doped n-type $Al_{0.1}Ga_{0.9}N$ cladding layer. As a result, the reliability of the resultant laser device improves.

Although the thickness of the light absorption layer is 0.065 μm in this example, an effect equivalent to that described above can be obtained as long as the thickness is 0.05 μm or more. Accordingly, the number of Si-doped n-type $In_{0.2}Ga_{0.8}N$ layers and Si-doped n-type $In_{0.03}Ga_{0.97}N$ layers and the thickness of these layers may be varied in the formation of the light absorption layer of the MQW structure. The In contents of these layers are not restricted to those in this example. InGaN three-component mixed crystal having a different In content and InGaAlN four-component mixed crystal may be used as long as such materials absorb laser light.

Example 3

Figure 2:
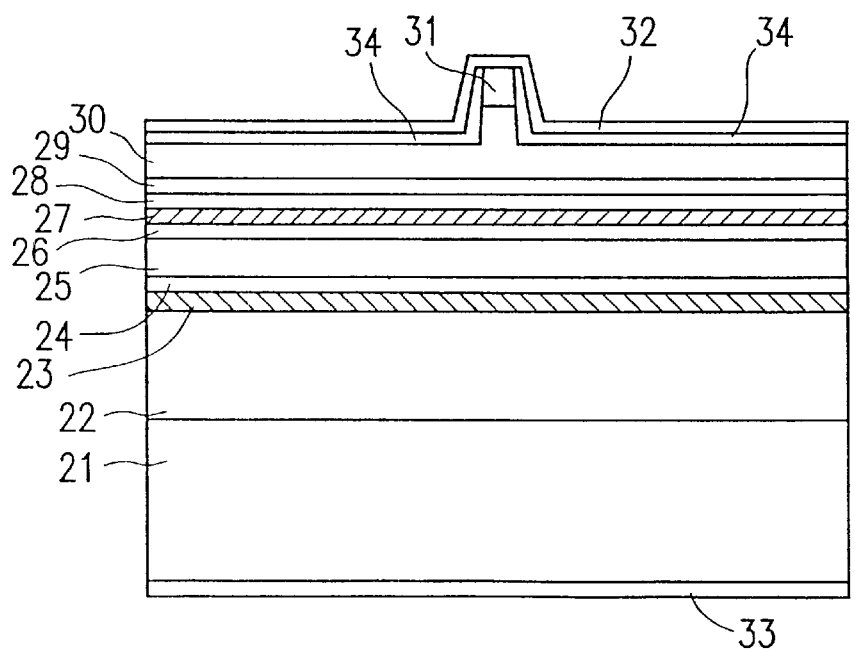
FIG. 2 is a sectional view of a semiconductor laser device of Example 3 according to the present invention.
Figure 3:
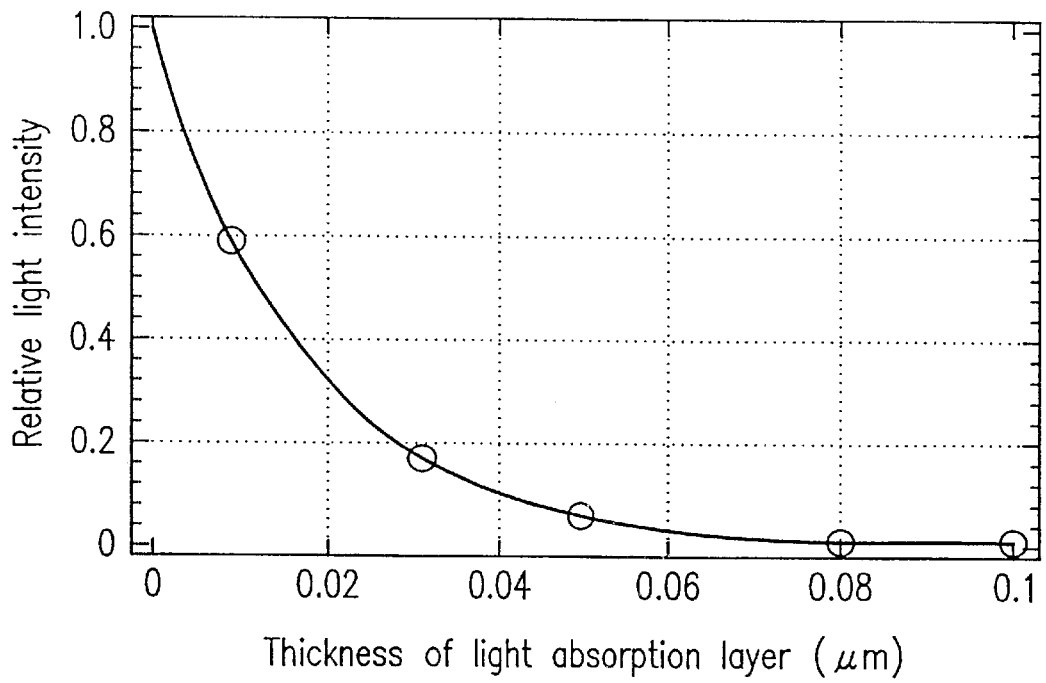
FIG. 3 is a graph showing the attenuation of the intensity of laser light having a wavelength of 410 nm when an $In_{0.2}Ga_{0.08}N$ light absorption layer is formed.
Figure 4:
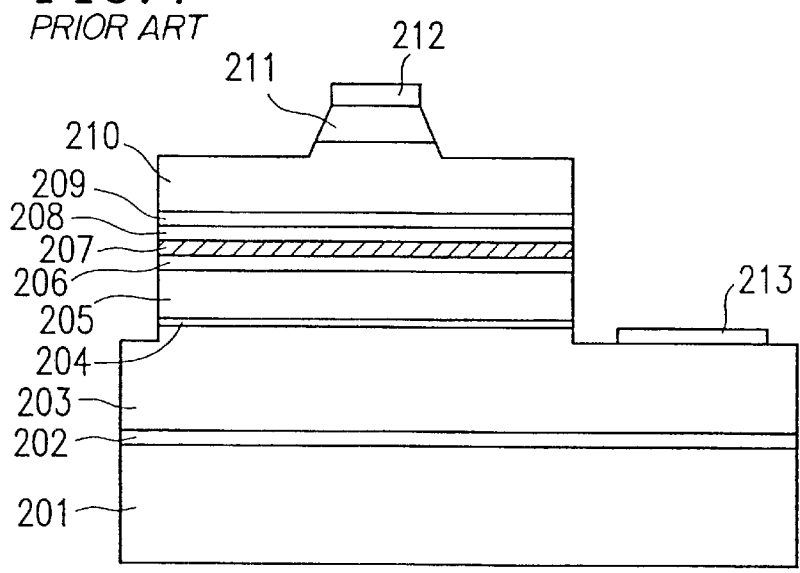
FIG. 4 is a sectional view of a conventional GaN group semiconductor laser device.
Figure 5:
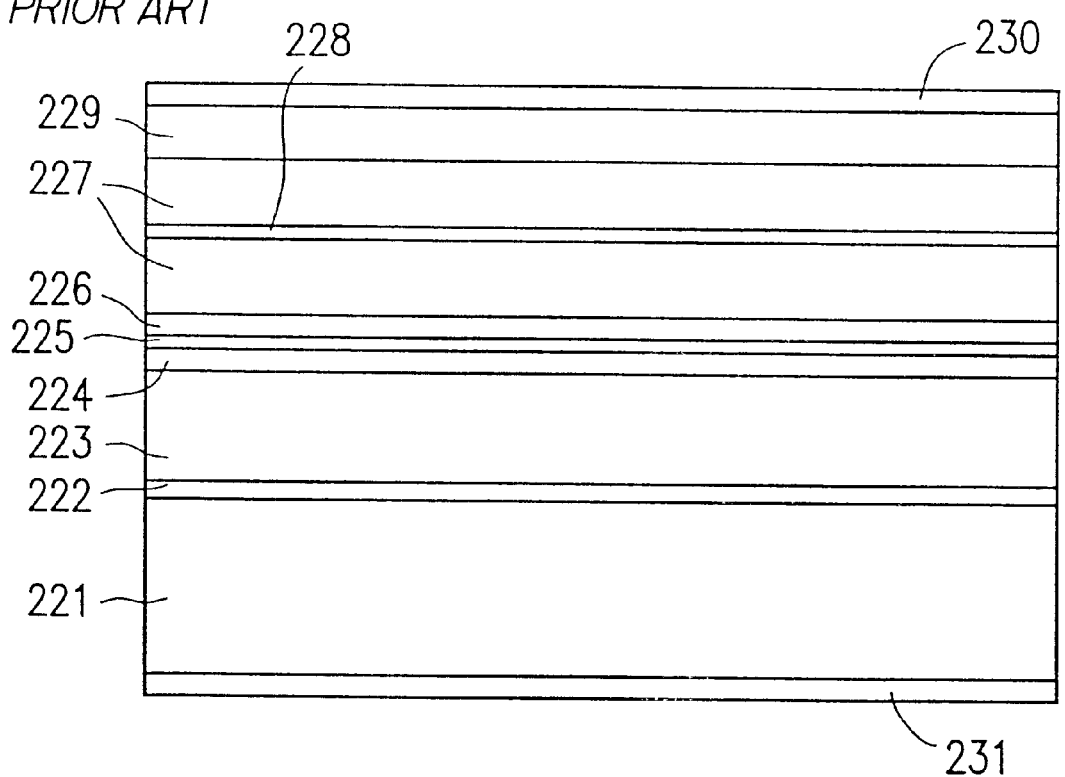
FIG. 5 is a sectional view of a conventional GaN group semiconductor laser device of a self-oscillation type.

FIG. 2 is a cross-sectional view of a GaN group semiconductor laser device of Example 3 according to the present invention. Referring to FIG. 2, the GaN group semiconductor laser device of Example 3 includes an n-type GaN substrate 21 having a c plane surface, an n-type GaN contact layer 22, a light absorption layer 23 of a MQW structure composed of seven n-type $In_{0.2}Ga_{0.8}N$ layers and six n-type $In_{0.03}Ga_{0.97}N$ layers, an n-type $Al_{0.2}Ga_{0.9}N$ evaporation prevention layer 24, an n-type $Al_{0.1}Ga_{0.9}N$ cladding layer 25, an n-type GaN guide layer 26, an active layer 27 of a MQW structure composed of three $In_{0.15}Ga_{0.85}N$ quantum well layers and two $In_{0.03}Ga_{0.97}N$ barrier layers, an $Al_{0.2}Ga_{0.8}N$ evaporation prevention layer 28, a p-type GaN guide layer 29, a p-type $Al_{0.1}Ga_{0.9}N$ cladding layer 30, a p-type GaN contact layer 31, a p-side electrode 32, an n-side electrode 33, and an $SiO_2$ insulating film 34.

Hereinafter, the method for fabricating the GaN group semiconductor laser device of this example will be described with reference to FIG. 2. First, a GaN group epitaxial wafer is formed by growing the above layers on the n-type GaN substrate 21 having a c plane surface and a thickness of 100 $\mu$m until the p-type GaN contact layer 31 is formed as the top layer by the same method as that in Example 2 except that the n-type GaN contact layer 22 is formed directly on the n-type GaN substrate 21 without forming a buffer layer therebetween.

The above wafer is then annealed in a nitrogen gas atmosphere at 800° C. to reduce the resistance of the Mg-doped p-type layers. The p-type GaN contact layer 31 and the p-type $Al_{0.1}Ga_{0.9}N$ cladding layer 30 are partially etched by a normal photolithographic and dry etching method so that a ridge structure of a 1.5 $\mu$m-wide stripe shape is formed on the top. Thereafter, the $SiO_2$ insulating film 34 with a thickness of 200 $\mu$m is formed on the side walls of the ridge and on the surface of the p-type layer other than the top surface of the ridge as a current blocking layer.

The p-side electrode 32 made of nickel and gold is formed on the surfaces of the $SiO_2$ insulating film 34 and the p-type GaN contact layer 31. The n-side electrode 33 made of titanium and aluminium is formed on the back surface of the n-type GaN substrate 21. Thus, a GaN group semiconductor laser device wafer is completed.

The wafer is then cleaved in a direction perpendicular to the direction of the ridge stripe to form the end face of the laser resonator which extends in the direction of the ridge stripe. In this example, the length of the resonator is 500 $\mu$m. The resultant laser device is divided into laser chips. Each chip is mounted on a stem and the p-side electrode 32 is connected to a lead terminal by wire bonding, thereby to complete the GaN group semiconductor laser device. In this example, the n-side electrode 33 is formed on the back surface of the n-type GaN substrate 21 without polishing the substrate. Alternatively, the n-side electrode 33 may be formed on the back surface of the n-type GaN substrate 21 after the back side is polished by a normal polishing technique to reduce the thickness of the wafer. Thereafter, the resultant wafer may be cleaved in a direction perpendicular to the ridge stripe. In this case, since the substrate is thinned, cleaving becomes easy.

The thus-fabricated GaN group semiconductor laser device of this example has an oscillation wavelength of 410 nm and an oscillation threshold current of 30 mA, exhibiting good laser characteristics like those in Example 2. Since the light absorption layer 23 of the MQW structure is formed, return light incident on the GaN substrate is blocked from interacting with laser light in the active region. Thus, the semiconductor laser device can provide output light with stable intensity without interference of return light. Since the GaN substrate has a refractive index larger than the sapphire substrate, return light incident on the substrate less easily enters the layers formed on the substrate by crystal growth. Accordingly, the GaN group semiconductor laser device of this example which uses the GaN substrate can more effectively prevent return light incident on the substrate from interacting with laser light in the active region, compared with the case of using a sapphire substrate.

In this example, the ridge stripe is narrowed so that the portion of the active layer located outside the ridge stripe region works as a saturable absorption layer providing the self-oscillation property. Although the light absorption layer in this example is composed of the MQW structure, it may be composed of a single layer. Although the thickness of the light absorption layer is 0.065 $\mu$m in this example, an effect equivalent to that described above can be obtained as long as the thickness is 0.05 $\mu$m or more. Accordingly, the number of Si-doped n-type $In_{0.2}Ga_{0.8}N$ layers and Si-doped n-type $In_{0.3}Ga_{0.97}N$ layers and the thickness of these layers may be varied in the formation of the light absorption layer of the MQW structure. The In contents of these layers are not restricted to those in this example. InGaN three-component mixed crystal having a different content and InGaAlN four-component mixed crystal may be used as long as such materials absorb laser light.

In this example, n-type gallium nitride is used for the substrate. The p-type and n-type conductivity may be reversed from the construction described above. In this example, the $SiO_2$ insulating film 34 is used as the current blocking layer. Alternatively, other dielectric insulating films such as an SiN film and n-type conductive and semi-insulating semiconductor materials may also be used as the current blocking layer.

Example 4

Figure 6:
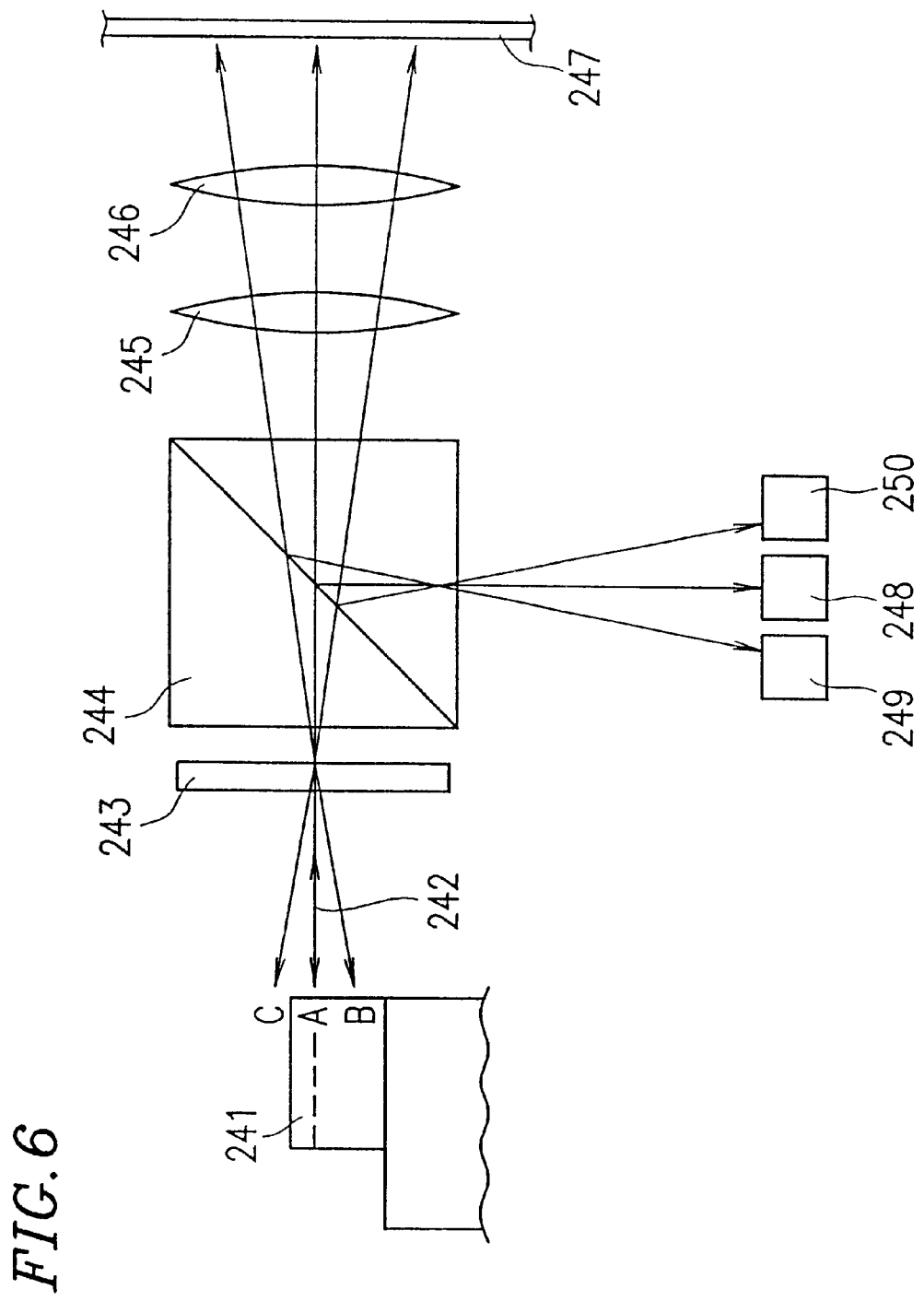
FIG. 6 is a view schematically illustrating an optical pickup apparatus having a tracking servo mechanism employing the three-beam method.
Figure 7:
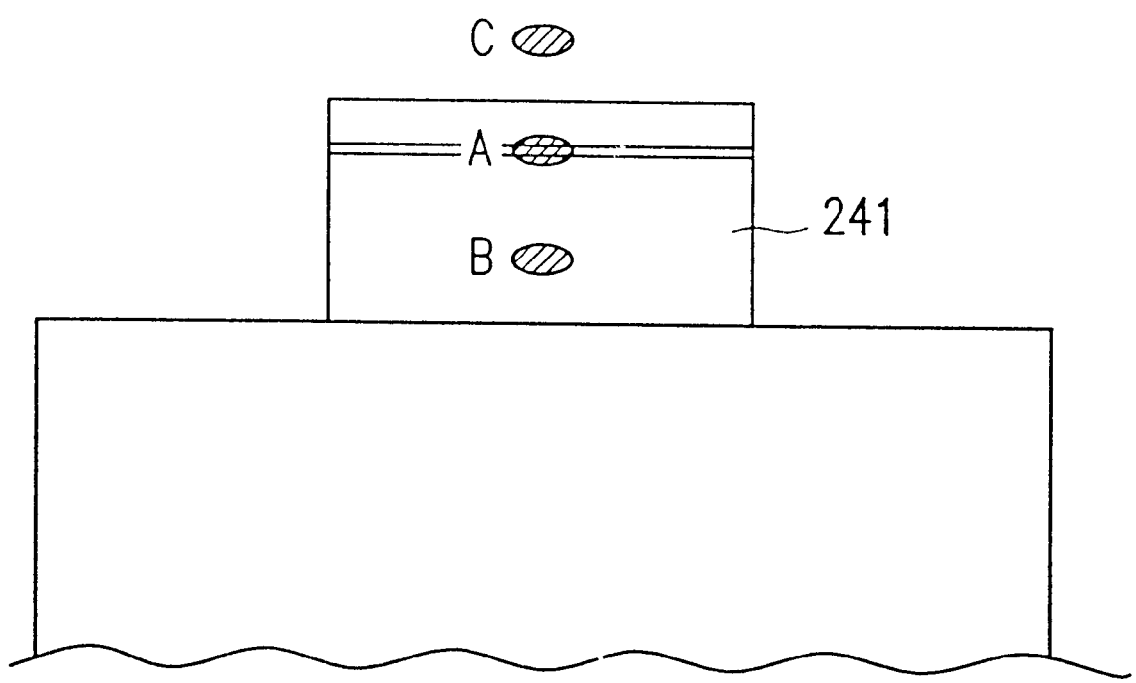
FIG. 7 is a front view of a semiconductor laser device used in the optical pickup apparatus of FIG. 6.

In this example, an optical pickup apparatus employing the three-beam method shown in FIG. 6 is fabricated using the GaN group semiconductor laser device of Example 3 as a light source.

The semiconductor laser device used in this example includes the light absorption layer which blocks return light incident on the n-type GaN substrate from interacting with laser light in the active region. Thus, the semiconductor laser device can provide output light with stable intensity without the influence of return light. Further, since the semiconductor laser device has the self-oscillation property, generation of noise caused by return light directly returning to the active region is suppressed. As a result, when the optical pickup apparatus of this example is used to read data from an optical disk, data read without error is possible.

Optical pickup apparatus which realize data read without error as described above can also be obtained by using the GaN group semiconductor laser devices of Examples 1 and 2.

Thus, according to the present invention, the GaN group semiconductor laser device includes a light absorption layer formed between the substrate and the lower cladding layer. The light absorption layer is made of a semiconductor having an energy gap substantially equal to or smaller than that of the active layer. As a result, although three return beams are generated during the control of the tracking servo mechanism by the three-beam method and one of the three return beams is incident on the substrate, such a return beam is blocked from interacting with laser light in the active region.

Thus, the semiconductor laser device according to the present invention can provide output light with stable intensity without the influence of return light. Although the light absorption layer is formed, laser light in the active layer will not be absorbed by the light absorption layer because the laser light does not expand to reach the light absorption layer. Therefore, the oscillation threshold current value is not increased. The resultant GaN semiconductor laser device has good laser characteristics, can be used for an optical disk system, and is free from occurrence of data read error.

When the light absorption layer is of a MQW structure, the semiconductor laser device is advantageous in that the intensity of output light is free from an influence of return light and that crystal defect caused by a distortion due to the difference in lattice constant is reduced.

The optical pickup apparatus having a tracking servo mechanism employing the three-beam method is fabricated using as a light source the GaN group semiconductor laser device including the light absorption layer as described above. The resultant optical pickup apparatus allows for data read from an optical disk without error.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A gallium nitride group semiconductor laser device including an active layer made of a nitride semiconductor formed between cladding layers made of a nitride semiconductor on a substrate, wherein a light absorption layer is formed between the substrate and one of the cladding layers located closer to the substrate, the light absorption layer being made of a semiconductor having an energy gap substantially equal to or smaller than an energy gap of the active layer.

2. A gallium nitride group semiconductor laser device according to claim 1, wherein the light absorption layer is of a multi-quantum well structure including two types of semiconductors having different compositions which are alternately stacked.

3. A gallium nitride group semiconductor laser device according to claim 1, wherein the light absorption layer is made of a nitride semiconductor containing at least indium and gallium.

4. A gallium nitride group semiconductor laser device according to claim 1, wherein the substrate is made of a material selected from the group consisting of sapphire, gallium nitride, and silicon carbide.

5. A gallium nitride group semiconductor laser device according to claim 1, wherein the thickness of the light absorption layer is 0.05 $\mu$m or more.

6. An optical pickup apparatus of a three-beam method comprising an optical system including at least a semiconductor laser device and a diffraction grating, wherein the semiconductor laser device is a gallium nitride group semiconductor laser device including an active layer made of a nitride semiconductor formed between cladding layers made of a nitride semiconductor on a substrate, and wherein a light absorption layer is formed between the substrate and one of the cladding layers located closer to the substrate, the light absorption layer being made of a semiconductor having an energy gap substantially equal to or smaller than an energy gap of the active layer.

7. A gallium nitride group semiconductor laser device according to claim 1, further including guide layers made of a nitride semiconductor on the substrate, wherein the active layer is formed between the guide layers.

8. A gallium nitride group semiconductor laser device according to claim 7, wherein the guide layers are formed between the cladding layers.

9. An optical pickup apparatus according to claim 6, wherein the gallium nitride group semiconductor laser device further includes guide layers made of a nitride semiconductor on the substrate, and the active layer is formed between the guide layers.

10. An optical pickup apparatus according to claim 9, wherein the guide layers are formed between the cladding layers.

* * * * *